US011321827B2

United States Patent
Hu (10) Patent No.: US 11,321,827 B2
(45) Date of Patent: May 3, 2022

(54) SYSTEM AND METHOD FOR FACILITATING AUTONOMOUS CONTROL OF AN IMAGING SYSTEM

(71) Applicant: Aivitae LLC, Redwood City, CA (US)

(72) Inventor: Bob Sueh-chien Hu, Los Altos Hills, CA (US)

(73) Assignee: Aivitae LLC, Redwood City, CA (US)

( * ) Notice: Subject to any disclaimer, the term of this patent is extended or adjusted under 35 U.S.C. 154(b) by 0 days.

(21) Appl. No.: 16/121,335

(22) Filed: Sep. 4, 2018

(65) Prior Publication Data

US 2018/0374216 A1 Dec. 27, 2018

Related U.S. Application Data

(63) Continuation of application No. 15/668,118, filed on Aug. 3, 2017.

(Continued)

(51) Int. Cl.
*G06T 7/00* (2017.01)
*G06N 20/00* (2019.01)
(Continued)

(52) U.S. Cl.
CPC .......... *G06T 7/0012* (2013.01); *G06K 9/036* (2013.01); *G06K 9/32* (2013.01); *G06K 9/46* (2013.01);
(Continued)

(58) Field of Classification Search
CPC ......... G06T 7/75; G06T 7/0012; G06N 20/00; G06N 3/084; G06K 9/036; G06K 9/32; G06K 9/6232; G06K 2209/05; G06K 9/46
See application file for complete search history.

(56) References Cited

U.S. PATENT DOCUMENTS

2003/0194124 A1 10/2003 Suzuki et al.
2004/0218804 A1 11/2004 Affleck et al.
(Continued)

FOREIGN PATENT DOCUMENTS

EP 0772145 A2 5/1997
WO 2016/019347 A1 2/2016
(Continued)

OTHER PUBLICATIONS

Tong Xiao, Tian Xia, Yi Yang, Chang Huang, Xiaogang Wang, "Learning from Massive Noisy Labeled Data for Image Classification", CVPR2015 paper, IEEE, pp. 2619-2699, 2015 (Year: 2015).*
(Continued)

*Primary Examiner* — Eric Nilsson
(74) *Attorney, Agent, or Firm* — Perkins Coie LLP (57) ABSTRACT

The present disclosure pertains to autonomous control of an imaging system. In some embodiments, training information including at least a plurality of images and action information are received. The plurality of images and action information are provided to a prediction model to train the prediction model. Further, an image capturing device is controlled to capture an image of a portion of a living organism, the image is processed, via the prediction model, to determine an action to be taken with respect to the image, and the determined action is taken with respect to the image.

20 Claims, 6 Drawing Sheets

Related U.S. Application Data (60) Provisional application No. 62/500,331, filed on May 2, 2017.

(51) Int. Cl.
| | | |
|---|---|---|
| *G06K 9/03* | (2006.01) | |
| *G06N 3/08* | (2006.01) | |
| *G06K 9/62* | (2006.01) | |
| *G06T 7/73* | (2017.01) | |
| *G06K 9/32* | (2006.01) | |
| *G06K 9/46* | (2006.01) | |

(52) U.S. Cl.
CPC .......... *G06K 9/6232* (2013.01); *G06N 3/084* (2013.01); *G06N 20/00* (2019.01); *G06T 7/75* (2017.01); *G06K 2209/05* (2013.01)

(56) References Cited

U.S. PATENT DOCUMENTS

| | | | |
|---|---|---|---|
| 2004/0253742 A1* | 12/2004 | Affleck | ................. C30B 7/00 436/165 |
| 2014/0111199 A1 | 4/2014 | Oh et al. | |
| 2014/0347511 A1 | 11/2014 | Rodriguez-Serrano et al. | |
| 2016/0086078 A1 | 3/2016 | Ji et al. | |
| 2016/0127641 A1* | 5/2016 | Gove | ................. H04N 5/23206 348/143 |
| 2016/0317127 A1 | 11/2016 | Dos Santos Mendonca et al. | |
| 2016/0364526 A1* | 12/2016 | Reicher | ................. G06F 3/0488 |
| 2016/0364857 A1 | 12/2016 | Reicher et al. | |
| 2017/0011185 A1 | 1/2017 | Schweizer | |
| 2017/0103512 A1 | 4/2017 | Mailhe et al. | |
| 2017/0116497 A1 | 4/2017 | Georgescu et al. | |
| 2017/0337682 A1* | 11/2017 | Liao | ......................... G06T 7/30 |
| 2018/0005079 A1* | 1/2018 | Tosic | ..................... G06N 3/084 |
| 2018/0260772 A1* | 9/2018 | Chaubard | ............ G06Q 10/087 |
| 2018/0322629 A1 | 11/2018 | Hu | |
| 2018/0367752 A1* | 12/2018 | Donsbach | ............ H04N 19/426 |
| 2019/0228298 A1 | 7/2019 | Suzuki et al. | |
| 2020/0168320 A1 | 5/2020 | Hu | |

FOREIGN PATENT DOCUMENTS

| | | |
|---|---|---|
| WO | 2016-025189 A1 | 2/2016 |
| WO | 2016/100717 A1 | 6/2016 |

OTHER PUBLICATIONS

International Search Report and Written Opinion of the International Searching Authority dated Jul. 25, 2018 in related PCT Application No. PCT/US2018/026062, 8 pages.

International Preliminary Report on Patentability issued in corresponding PCT/US2018/026062 dated Nov. 14, 2019 (7 pages).

Notice of Allowance issued in corresponding U.S. Appl. No. 16/738,272 dated Mar. 20, 2020 (8 pages).

Jing Wang et al., "Deep Learning for Quality Assessment of Retinal OCT Images," Biomedical Optics Express, vol. 10, No. 12, pp. 6057-6072 (Year: 2019).

Non-Final Office Action issued in corresponding U.S. Appl. No. 15/668,118 dated Aug. 12, 2020 (21 pages).

Extended European Search Report issued in corresponding European Application No. 18794437.6 dated Dec. 22, 2020.

Final Office Action issued in corresponding U.S. Appl. No. 15/668,118 dated Feb. 22, 2021.

International Search Report and Written Opinion issued in corresponding International Application No. PCT/US2020/039116) dated Oct. 6, 2020.

\* cited by examiner

SYSTEM AND METHOD FOR FACILITATING AUTONOMOUS CONTROL OF AN IMAGING SYSTEM

RELATED APPLICATIONS

This application is a continuation of U.S. patent application Ser. No. 15/668,118, filed on Aug. 3, 2017, entitled, "SYSTEM AND METHOD FOR FACILITATING AUTONOMOUS CONTROL OF AN IMAGING SYSTEM," which claims the benefit of U.S. Provisional Application No. 62/500,331, filed on May 2, 2017, entitled, "AUTONOMOUS SELF-LEARNING AND SELF-EXECUTING MEDICAL IMAGING SYSTEM," each of which is hereby incorporated by reference herein in its entirety.

FIELD OF THE INVENTION

This invention relates to autonomous control of an imaging system, including, for example, training a neural network or other prediction model to autonomously control an imaging system.

BACKGROUND OF THE INVENTION

Currently, there are imaging systems that acquire images for diagnostic purposes. However, the conventional imaging systems lack the ability to improve with learning and thus produce images that may include errors. Accordingly, correcting the errors in the images produced by conventional imaging systems can be time consuming and inefficient. For instance, traditional image processing algorithms, such as the Siemens "dot-engine" product, lack the ability to improve with learning. As such, errors may be produced by this product and correcting these errors can be time consuming and inefficient. These and other drawbacks exist.

SUMMARY OF THE INVENTION

Accordingly, one aspect of the disclosure relates to system for facilitating autonomous control of an imaging system. The system includes one or more processors and/or other components. The one or more processors are configured by machine-readable instructions to: receive training information, the training information including at least (i) a plurality of images that each correspond to a portion of a living organism, and (ii) for each image of the plurality of images, action information indicating one or more actions taken with respect to the image, the one or more actions including acceptance of the image, discarding of the image, or retaking a subsequent image of the portion of the living organism to which the image corresponds to replace the image; provide, as input to a prediction model, the plurality of images and the action information for the plurality of images to train the prediction model regarding an action to take with respect to a new image corresponding to the portion of the living organism; control, using the prediction model, an image capturing device to capture a first image of a first portion of a first living organism; process, via the prediction model, the first image to determine a first action to be taken with respect to the first image, the determination of the first action being based on the training of the prediction model; and cause the first action to be taken with respect to the first image.

Another aspect of the disclosure relates to a method for facilitating autonomous control of an imaging system. The method includes: receiving training information, the training information including at least (i) a plurality of images that each correspond to a portion of a living organism, and (ii) for each image of the plurality of images, action information indicating one or more actions taken with respect to the image, the one or more actions including acceptance of the image, discarding of the image, or retaking a subsequent image of the portion of the living organism to which the image corresponds to replace the image; providing, as input to a prediction model, the plurality of images and the action information for the plurality of images to train the prediction model regarding an action to take with respect to a new image corresponding to the portion of the living organism; controlling, using the prediction model, an image capturing device to capture a first image of a first portion of a first living organism; processing, via the prediction model, the first image to determine a first action to be taken with respect to the first image, the determination of the first action being based on the training of the prediction model; and causing the first action to be taken with respect to the first image.

Various other aspects, features, and advantages of the invention will be apparent through the detailed description of the invention and the drawings attached hereto. It is also to be understood that both the foregoing general description and the following detailed description are exemplary and not restrictive of the scope of the invention. As used in the specification and in the claims, the singular forms of "a," "an," and "the" include plural referents unless the context clearly dictates otherwise. In addition, as used in the specification and the claims, the term "or" means "and/or" unless the context clearly dictates otherwise.

DETAILED DESCRIPTION OF THE INVENTION

In the following description, for the purposes of explanation, numerous specific details are set forth in order to provide a thorough understanding of the embodiments of the invention. It will be appreciated, however, by those having skill in the art that the embodiments of the invention may be practiced without these specific details or with an equivalent arrangement. In other instances, well-known structures and devices are shown in block diagram form in order to avoid unnecessarily obscuring the embodiments of the invention.

Figure 1:
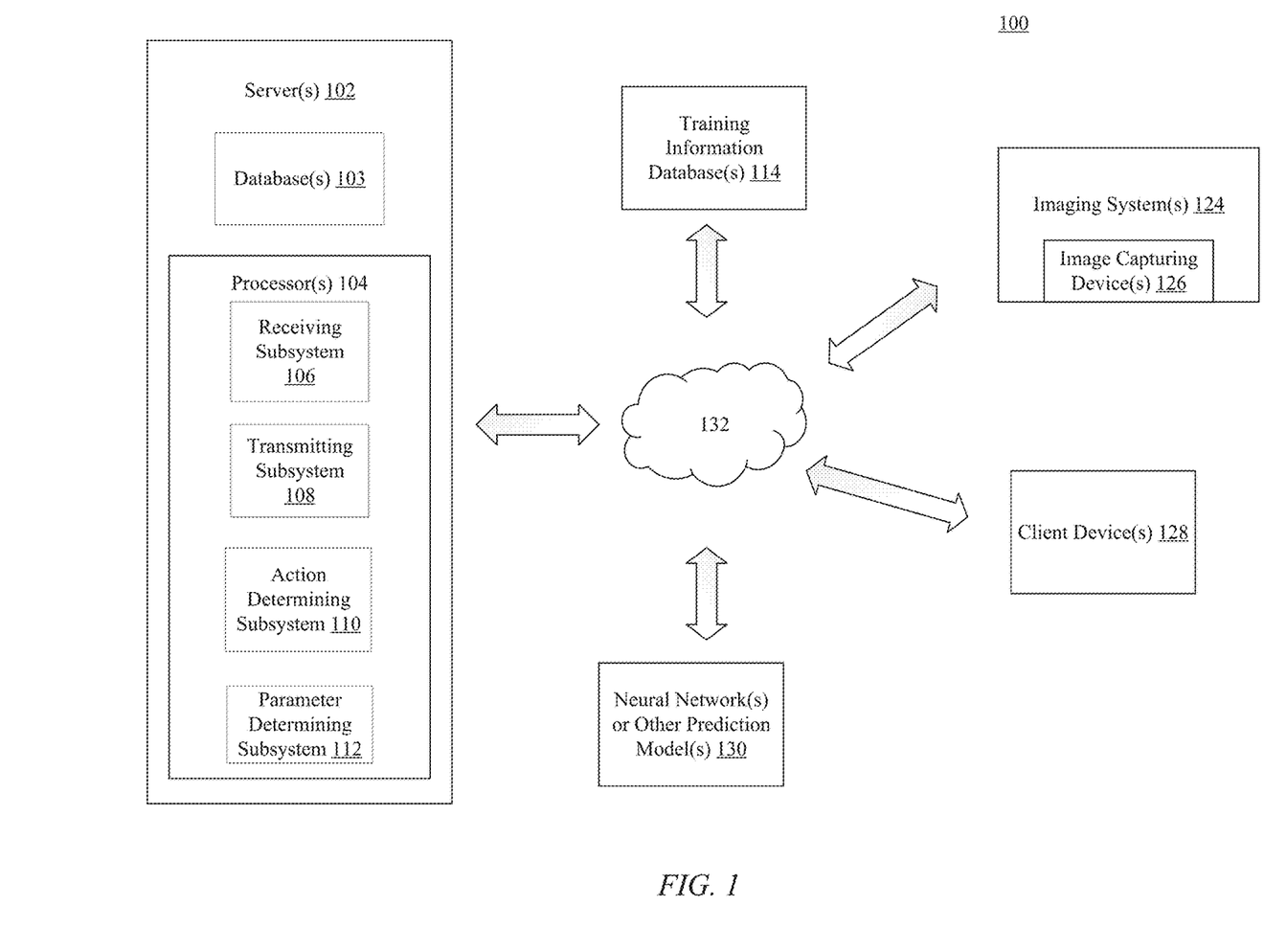
FIG. 1 illustrates a system for facilitating autonomous control of an imaging system, in accordance with one or more embodiments.

FIG. 1 illustrates a system 100 for facilitating autonomous control of an imaging system(s) 124, in accordance with one or more embodiments. As illustrated in FIG. 1, system 100 may include server(s) 102, training information database(s) 114, imaging system(s) 124 (for example, a medical imaging system), client device(s) 128, a neural network(s) (or other prediction model(s)) 130, a network(s) 132 (for example, internet, LAN, WAN, etc.), or other components. The server(s) 102, training information database(s) 114, imaging system(s) 124, client device(s) 128, and neural network(s) (or other prediction model(s)) 130 may include communication lines or ports to enable the exchange of information with the network 132 or other computing platforms via wired or wireless techniques (e.g., Ethernet, fiber optics, coaxial cable, WiFi, Bluetooth, near field communication, or other technologies).

In some embodiments, the server(s) 102 may include a database(s) 103 and processor(s) 104 including a receiving subsystem 106, a transmitting subsystem 108, an action determining subsystem 110, and a parameter determining subsystem 112. Each imaging system(s) 124 includes an image capturing device(s) 126. Each client device(s) 128 may include any type of mobile terminal, fixed terminal, or other device. By way of example, client device(s) 128 may include a desktop computer, a notebook computer, a tablet computer, a smartphone, a wearable device, or other client device. Users may, for instance, utilize one or more client devices(s) 128 to interact with one another, one or more servers, or other components of system 100.

It should be noted that, while one or more operations are described herein as being performed by particular components of server(s) 102, those operations may, in some embodiments, be performed by other components of server(s) 102 or other components of system 100. As an example, while one or more operations are described herein as being performed by components of server(s) 102, those operations may, in some embodiments, be performed by components of client device(s) 128 or by components of the imaging system(s) 124. Further, as an example, although the neural network(s) (or other prediction model(s)) 130 is illustrated as being separate from the server(s) 102, the imaging system(s) 124, and the client device(s) 128, the operations performed by the neural network(s) (or other prediction model(s)) 130 may, in some embodiments, be performed by components of the client device(s) 128, the imaging system(s) 124, or the server(s) 102. The imaging system(s) 124 may include an X-Ray imaging system (including an X-ray imaging device), an Ultrasound imaging system (including an Ultrasound device), an MRI (Magnetic Resonance Imaging) system (including an MRI device), a nuclear medicine imaging system (including a nuclear medicine imaging device), or any other imaging system.

Prediction Model Training

In some embodiments, system 100 may facilitate training of a prediction model 130 (e.g., a neural network or other prediction model) via training information stored in the training information database(s) 114 for rapid, complete, and accurate acquisition of images of a portion of a living organism. The training information may include, but is not limited to, a plurality of images (e.g., 1,000 or more, 10,000 or more, 100,000 or more, 1,000,000 or more, 10,000,000 or more, etc.) corresponding to a portion (or portions) of a living organism (or a non-living object), information corresponding to an image capturing device(s) 126 that captured each of the plurality of images, action information corresponding to each of the plurality of images, and parameter information corresponding to each of the plurality of images. All of the above listed training information within the training information database(s) 114 may be updated continuously based on continuous reception of additional training information from other sources (for example, an imaging system(s) 124, or other external sources that are not illustrated).

In some embodiments, action information may include information regarding an action taken with respect to an individual image. For example, action information may include acceptance of the image, discarding of the image, or retaking a subsequent image of the portion of the living organism. The action information that is stored in the training information database(s) 114 may be based on acquired historical information. For instance, the action information that is stored in the training information database(s) 114 may be based on the actions taken by robots, computers, or technicians or based on an action determined via the neural network(s) 130 for each of the images stored in the training information database(s) 114.

In some embodiments, parameter information may include any information regarding the parameters that are used to capture images. For example, parameter information may include size of the image, a location of a portion of a living organism, types of images, image contrast, image brightness, image color, image resolution, transmission power of the image capturing device(s) 126, recording frequency of the image capturing device(s) 126, coordinates of imaging planes, flip angle, field-of-view, off resonance frequencies, excitation frequencies of the image capturing device(s) 126, output intensity of the image capturing device(s) 126, and any other parameters that are used to capture an image by the image capturing device(s) 126.

In some embodiments, an image capturing device(s) 126 may an X-ray device, an ultrasound device, an MRI (Magnetic Resonance Imaging) device, a nuclear medicine imaging device, or any other imaging device. Table 1 illustrates, as an example, the training information stored in the training information database(s) 114. Although Table 1 only illustrates images, information corresponding to an image capturing device(s) 126 that captured each of the images, action information corresponding to each of the images, and parameter information corresponding to each of the images, it should be understood that other types of information related to the information in Table 1 can be included in the training information database(s) 114 (for example, information indicating which portion of a living organism is captured in the image).

TABLE 1

| Image | Image capturing device | Action information | Parameter information |
|---|---|---|---|
| 1 | X-ray | Accept | Imaging coordinates, Radiation dose, etc. |
| 2 | MRI | Discard | Excitation frequency, coordinates of imaging planes, etc. |
| 3 | Ultrasound | Retake a subsequent image | Size of the image, location of a portion of the living organism, output frequency, etc. |
| ... | ... | ... | ... |
| ... | ... | ... | ... |
| n | MRI | Accept | Imaging coordinates, Radiation dose, etc. |

In some embodiments, the training information may be continuously received by the server(s) 102 (for example, by the receiving subsystem 106) from the training information database(s) 114. The training information can be received by the server(s) 102 at any set interval (e.g., every hour, every day, every month, every year, or any other set interval). The training information can either be sent from the training information database(s) 114 at set intervals or can be requested by the server(s) 102 at set intervals. Once the training information is received by the server(s) 102 via network 132, the training information is forwarded to the neural network(s) (or other prediction model(s)) 130 to train the neural network(s) (or other prediction model(s)) 130.

As an example, the neural network(s) (or other prediction model(s)) 130 may be based on a large collection of neural units (or artificial neurons). The neural network(s) (or other prediction model(s)) 130 may loosely mimic the manner in which a biological brain works (e.g., via large clusters of biological neurons connected by axons). Each neural unit of the neural network(s) (or other prediction model(s)) 130 may be connected with many other neural units of the neural network(s) (or other prediction model(s)) 130. Such connections can be enforcing or inhibitory in their effect on the activation state of connected neural units. In some embodiments, each individual neural unit may have a summation function which combines the values of all its inputs together. In some embodiments, each connection (or the neutral unit itself) may have a threshold function such that the signal must surpass the threshold before it is allowed to propagate to other neural units. These neural network systems may be self-learning and trained, rather than explicitly programmed, and can perform significantly better in certain areas of problem solving, as compared to traditional computer programs. In some embodiments, the neural network(s) (or other prediction model(s)) 130 may include multiple layers (e.g., where a signal path traverses from front layers to back layers). In some embodiments, back propagation techniques may be utilized by the neural network(s) (or other prediction model(s)) 130, where forward stimulation is used to reset weights on the "front" neural units. In some embodiments, stimulation and inhibition for the neural network(s) (or other prediction model(s)) 130 may be more free-flowing, with connections interacting in a more chaotic and complex fashion.

Once the neural network(s) (or other prediction model(s)) 130 has been trained using the training information, the neural network(s) (or other prediction model(s)) 130 is ready to be used. The neural network(s) (or other prediction model(s)) 130 can be continuously updated based on additional training information received from the training information database(s) 114 via the server(s) 102, or can be updated based on user feedback information received from the client device(s) 128 or technician/doctor feedback information received from the imaging system(s) 124.

Autonomous Control

In some embodiments, an image captured by an image capturing device(s) 126 is input into the neural network(s) (or other prediction model(s)) 130 via the server(s) 102. In some embodiments, the neural network(s) (or other prediction model(s)) 130 can be trained based on the above-noted description or a pre-trained neural network(s) (or other prediction model(s)) 130 can be used for autonomously controlling the image capturing system(s) 124 (including the image capturing device(s) 126). The image that is captured by the image capturing device(s) 126 can be requested to be captured by an operator of the image capturing device(s) 126 or by a client device(s) 128 via a network 132. The parameters for capturing the image can be entered by the operator of the image capturing device(s) 126 or by the client device(s) 128 via the network 132. Alternatively, the server(s) 102 can request the neural network(s) (or other prediction model(s)) 130 to provide information regarding parameters for capturing an image and based on the provided information, the server(s) 102 can control the image capturing device(s) 126 (via the network 132) to capture the image. The request from the server(s) 102 to the neural network(s) (or other prediction model(s)) 130 for information regarding parameters for capturing an image may be based on a request from the client device(s) 128 or an operator of the image capturing device(s) 126 to capture an image of a portion of a living organism. For example, the server(s) 102 may request parameter information regarding an MRI scan of a knee of a person as an input into the neural network(s) (or other prediction model(s)) 130 based on a request from the client device(s) 128 or an operator of the image capturing device(s) 126. In response to such an input, the neural network(s) (or other prediction model(s)) 130 may respond with parameter information to the server(s) 102, and the server(s) 102, via the parameter determination subsystem 112 and the neural network(s) (or other prediction model(s)) 130, can interpret the parameter information to determine the parameters for capturing an image by the image capturing device(s) 126.

In some embodiments, when an image (for example, of a portion of a living organism) captured by the image capturing device(s) 126 is received by the server(s) 102 via the network 132, the image is sent as an input to the neural network(s) (or other prediction model(s)) 130. Although the example provided above corresponds to an image of a portion of living organism, the captured image can correspond to any living organism or a non-living object. The image is then processed via the neural network(s) (or other prediction model(s)) 130 to determine an action to be taken with respect to the image. As previously indicated, examples of actions to be taken with respect to the image include, but are not limited to, accepting the image, discarding the image, or retaking a subsequent image of the portion of the living organism. An action to accept an image may indicate that the image does not include an error, and an action to discard the image or retake a subsequent image may indicate that the image includes an error. For example, an image may be determined to include an error when an excitation frequency to capture the first image is an incorrect frequency, when the image is blurry, when a position of a portion of a living organism within the image deviates from a center of the image by a predetermined threshold, or any other measure to determine an error in the image.

In some embodiments, in response to the image input from the server(s) 102, the neural network(s) (or other prediction model(s)) 130 provides, to the server(s) 102, action information regarding an action to be taken with respect to the image. In other words, the action information is determined by the neural network(s) (or other prediction model(s)) 130 based on the training of the neural network(s) (or other prediction model(s)) 130 and the image input into the neural network(s) (or other prediction model(s)) 130. The server(s) 102 (e.g., action determining subsystem 110) interprets the action information, received from the neural network(s) (or other prediction model(s)) 130, regarding an action to be taken with respect to the image, and determines an action to be taken with respect to the image based on the action information received from the neural network(s) (or other prediction model(s)) 130.

In some embodiments, action information, provided by the neural network(s) (or other prediction model(s)) 130, regarding an action to be taken with respect to the image may include suggestion information. The suggestion information may include, for example, a 20% suggestion to retake a subsequent image and an 80% suggestion to accept the image. In other words, suggestion information may provide information regarding a suggestion percentage for an action to be taken with respect to the image. Accordingly, the server(s) 102 (e.g., action determining subsystem 110) can determine an action to be taken with respect to the image based on the suggestion information.

In some embodiments, the server(s) 102 (e.g., action determining subsystem 110) may evaluate the suggestion information and determine an action to be taken with respect to the image based on the suggestion information. For instance, the server(s) 102 (e.g., action determining subsystem 110) may determine to accept the image when the suggestion percentage to accept the image is equal to or above a predetermined threshold. On the other hand, when the suggestion percentage to accept the image is below the predetermined threshold, the server(s) 102 (e.g., action determining subsystem 110) may determine to discard the image or retake a subsequent image. Similarly, the server(s) 102 (e.g., action determining subsystem 110) may determine to discard the image or retake a subsequent image when the suggestion percentage to discard the image or to retake a subsequent image is equal to or above a predetermined threshold. On the other hand, when the suggestion percentage to discard the image or retake a subsequent image is below the predetermined threshold, the server(s) 102 (e.g., action determining subsystem 110) may determine to accept the image.

Alternatively, in some embodiments, the server(s) 102 (e.g., action determining subsystem 110) may determine an action based on the highest suggestion percentage. For instance, if the suggestion information includes a 60% suggestion to retake a subsequent image and a 40% suggestion to accept the image, the server(s) 102 (e.g., action determining subsystem 110) may determine to retake a subsequent image.

In some embodiments, when a determination is made to accept the image by the server(s) 102 (e.g., action determining subsystem 110), the server(s) 102 may transmit the image via the network 132 to the client device(s) 128 and/or the imaging system(s) 124 so that the image can be displayed to a user of the client device(s) 128 or an operator or a doctor of the imaging system(s) 124. The determination to accept the image, discard the image, or retake a subsequent image may also be transmitted to a user of the client device(s) 128 or an operator of the imaging system(s) 124 as a notification. As noted above, an action to accept an image may indicate that the image does not include an error, and an action to discard the image or retake a subsequent image may indicate that the image includes an error.

On the other hand, in some embodiments, when a determination is made to retake a subsequent image, the server(s) 102 (e.g., action determining subsystem 110) controls the image capturing device(s) 126 to retake a subsequent image. When the neural network(s) (or other prediction model(s)) 130 provides action information to the server(s) 102 in response to an input of an image from the server(s) 102, the neural network(s) (or other prediction model(s)) 130 also provides parameter information to the server(s) 102 for retaking a subsequent image. The parameter information is determined by the neural network(s) (or other prediction model(s)) 130 based on the training of the neural network(s) (or other prediction model(s)) 130 and the image input into the neural network(s) (or other prediction model(s)) 130.

The parameter determining subsystem 112 receives the parameter information (e.g., via the receiving subsystem 106) and determines the parameters to be used for retaking a subsequent image. The parameter determining subsystem 112 also determines whether the parameters to be used for retaking a subsequent image are different from the parameters used for capturing the image that was input into the neural network(s) (or other prediction model(s)) 130. If the parameter determining subsystem 112 determines that the parameters to be used for retaking a subsequent image are different, the parameter determining subsystem 112 requests the transmitting subsystem 108 to transmit a request to the image capturing device(s) 126 (via network 132) to retake a subsequent image based on the parameters to be used for retaking a subsequent image. In other words, if the parameter determining subsystem 112 determines that the parameters to be used for retaking a subsequent image are different, the server(s) 102 controls the image capturing device(s) 126 to retake a subsequent image based on the parameters determined by the parameter determining subsystem 112. If the parameter determining subsystem 112 determines that the parameters to be used for retaking a subsequent image are different, such a determination may indicate that the image location (of the image that was input into the neural network(s) (or other prediction model(s)) 130) is off compared to a desired image location, that an MRI excitation frequency of an image capturing device(s) 126 that captured the image (e.g., the image that was input into the neural network(s) (or other prediction model(s)) 130) is a wrong frequency, etc. In addition to the request to retake a subsequent image from the server(s) 102 to the image capturing device(s) 126, the server(s) 102 may also send a notification to the image capturing device(s) 126 indicating the reason (for example, image location being off, wrong MRI excitation frequency, etc.) for different parameters to retake a subsequent image.

On the other hand, in some embodiments, if the parameter determining subsystem 112 determines that the parameters to be used for retaking a subsequent image are the same, the parameter determining subsystem 112 may determine that the image that was input into the neural network(s) (or other prediction model(s)) 130 is a blurry image (for example, either because of the movement of a portion of a living organism during capture of the portion of the living organism or because of a movement of the image capturing device(s) 126 itself during capture of the portion of the living organism). Accordingly, if the parameter determining subsystem 112 determines that the parameters to be used for retaking a subsequent image are the same, the parameter determining subsystem 112 requests the transmitting subsystem 108 to transmit a request to the image capturing device(s) 126 (via network 132) to retake a subsequent image based on the same parameters. In other words, if the parameter determining subsystem 112 determines that the parameters to be used for retaking a subsequent image are the same, the server(s) 102 controls the image capturing device(s) 126 to retake a subsequent image based on the same parameters. The request may also include a message requesting the living organism to be still during capture of the subsequent image and/or requesting an operator of the image capturing device(s) 126 to make sure that the image capturing device(s) 126 is still during capture of the subsequent image. The message can be displayed to the living organism, the operator of the image capturing device(s) 126, or via a display of the client device(s) 128. Accordingly, the system 100 is able to autonomously control the image capturing system(s) 124 (including the image capturing device(s) 126).

In some embodiments, after the subsequent image is captured by the image capturing device(s) 126, the subsequent image is sent back to the server(s) 102 (via network 132) and the above-described process by system 100 is repeated to process the subsequent image. Further, in some embodiments, the server(s) 102 may assign weights to a first parameter to be used to capture a first image of a first portion of a first living organism and a second parameter used to retake a subsequent first image of the first portion of the first living organism based on a time of capture of the first image and the subsequent first image, and provide, as an input to the neural network(s) (or other prediction model(s)) 130 the assigned weights to train the neural network(s) (or other prediction model(s)) 130.

Additionally, in some embodiments, a user feedback (either from the client device(s) 128 or from an operator of the imaging system(s) 124) can be provided to the server(s) 102 and the neural network(s) (or other prediction model(s)) 130 regarding the determination of an action with respect to an image and/or determination of parameters to be used to take a subsequent image. The user feedback can be used to update and train the neural network(s) (or other prediction model(s)) 130.

Example Flowcharts

The processing operations of each method presented below are intended to be illustrative and non-limiting. In some embodiments, for example, the methods may be accomplished with one or more additional operations not described, and/or without one or more of the operations discussed. Additionally, the order in which the processing operations of the methods are illustrated (and described below) is not intended to be limiting.

In some embodiments, the methods may be implemented in one or more processing devices (e.g., a digital processor, an analog processor, a digital circuit designed to process information, an analog circuit designed to process information, a state machine, and/or other mechanisms for electronically processing information). The processing devices may include one or more devices executing some or all of the operations of the methods in response to instructions stored electronically on an electronic storage medium. The processing devices may include one or more devices configured through hardware, firmware, and/or software to be specifically designed for execution of one or more of the operations of the methods.

Figure 2:
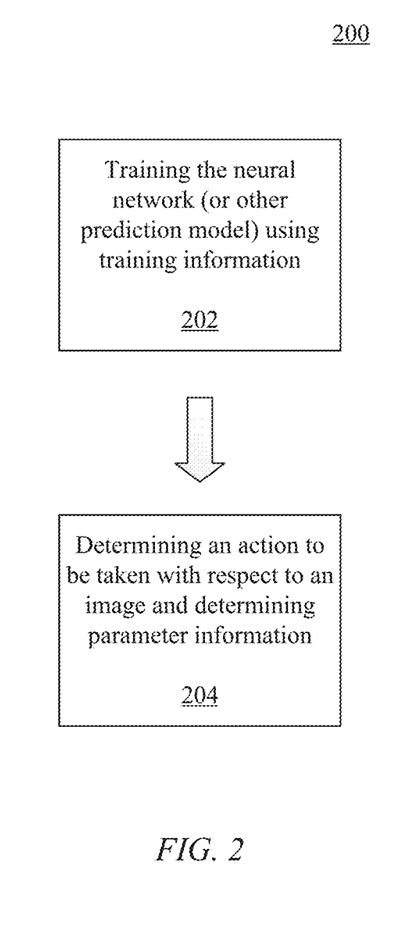
FIG. 2 illustrates a process for facilitating autonomous control of an imaging system, in accordance with one or more embodiments.

FIG. 2 illustrates a process for facilitating autonomous control of an imaging system(s) 124, in accordance with one or more embodiments. In operation 202, training information, including a plurality of images (e.g., 1,000 or more, 10,000 or more, 100,000 or more, 1,000,000 or more, 10,000,000 or more, etc.) corresponding to a portion (or portions) of a living organism (or a non-living object), information corresponding to an image capturing device(s) 126 that captured each of the plurality of images, action information corresponding to each of the plurality of images, and parameter information corresponding to each of the plurality of images are received by the server(s) 102. Additionally, in operation 202, the training information is provided, as an input, to the neural network(s) (or other prediction model(s)) 130 to train the neural network(s) (or other prediction model(s)) 130 regarding an action to take with respect to an image. Once the neural network(s) (or other prediction model(s)) 130 is trained using the training information, an action to be taken with respect to an image and parameters for retaking a subsequent image can be determined in operation 204. Operations 202 and 204 are described in further detail in FIGS. 3 and 4, respectively.

Figure 3:
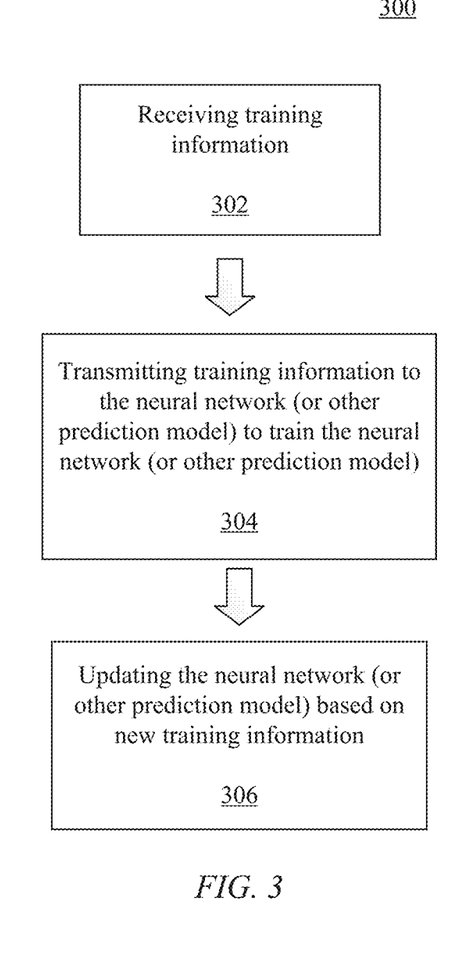
FIG. 3 illustrates an example flowchart of a method of training a neural network (or other prediction model), in accordance with one or more embodiments.

FIG. 3 illustrates an example flowchart of a method 300 of training the neural network(s) (or other prediction model(s)) 130. In operation 302, the training information from the training information database(s) 114 is received by the server(s) 102 (for example, by the receiving subsystem 106). In some embodiments, the training information may be stored in the database(s) 103. The training information is accumulated from one or more sources (for example, imaging system(s) 124 or any other external sources) and is stored in the training information database(s) 114. The training information may include, but is not limited to, a plurality of images (e.g., 1,000 or more, 10,000 or more, 100,000 or more, 1,000,000 or more, 10,000,000 or more, etc.) corresponding to a portion (or portions) of a living organism, information corresponding to an image capturing device(s) 126 that captured each of the plurality of images, action information corresponding to each of the plurality of images, and parameter information corresponding to each of the plurality of images. The action information and the parameter information stored in the training information database(s) 114 may be based on acquired historical information. For instance, the action information that is accumulated and stored in the training information database(s) 114 may include actions taken for each of the images by robots, computers, technicians, doctors, etc., and the parameter information may correspond to the parameters set by robots, computers, technicians, doctors, etc. to capture the plurality of images.

In some embodiments, action information may include acceptance of the image, discarding of the image, or retaking a subsequent image of the portion of the living organism (or a non-living object), and parameter information may include any information regarding the parameters that were used to capture an image. For example, parameter information may include size of the image, a location of a portion of a living organism, types of images, image contrast, image brightness, image color, image resolution, transmission power of the image capturing device(s) 126, recording frequency of the image capturing device(s) 126, coordinates of imaging planes, flip angle, field-of-view, off resonance frequencies, excitation frequencies of the image capturing device(s) 126, output intensity of the image capturing device(s) 126, and any other parameters that are used to capture an image by the image capturing device(s) 126. In some embodiments, the training information stored in the training information database(s) 114 is continuously updated based on training information received from one or more external sources (for example, imaging system(s) 124 or any other external source not illustrated).

In operation 304, the training information is transmitted from the server(s) 102 (for example, by the transmitting subsystem 108) to the neural network(s) (or other prediction model(s)) 130 via the network 132 to train the neural network(s) (or other prediction model(s)) 130. In some embodiments, once the neural network(s) (or other prediction model(s)) 130 has been trained, the neural network(s) (or other prediction model(s)) 130 may send a notification to the server(s) 102 indicating a completion of the training.

In operation 306, the neural network(s) (or other prediction model(s)) 130 may be updated based on new training information. In some embodiments, the training information that is stored in the training information database(s) 114 can be updated at any set interval (e.g., every hour, every day, every month, or every year). The updated training information can then be transmitted to the server(s) 102 and the neural network(s) (or prediction model(s)) 130 at any set interval (e.g., every hour, every day, every month, or every year) to update the neural network(s) (or other prediction model(s)) 130. The neural network(s) (or other prediction model(s)) 130 can also be updated based on user feedback information received from the client device(s) 128 or technician/doctor feedback information received from the imaging system(s) 124.

Figure 4A:
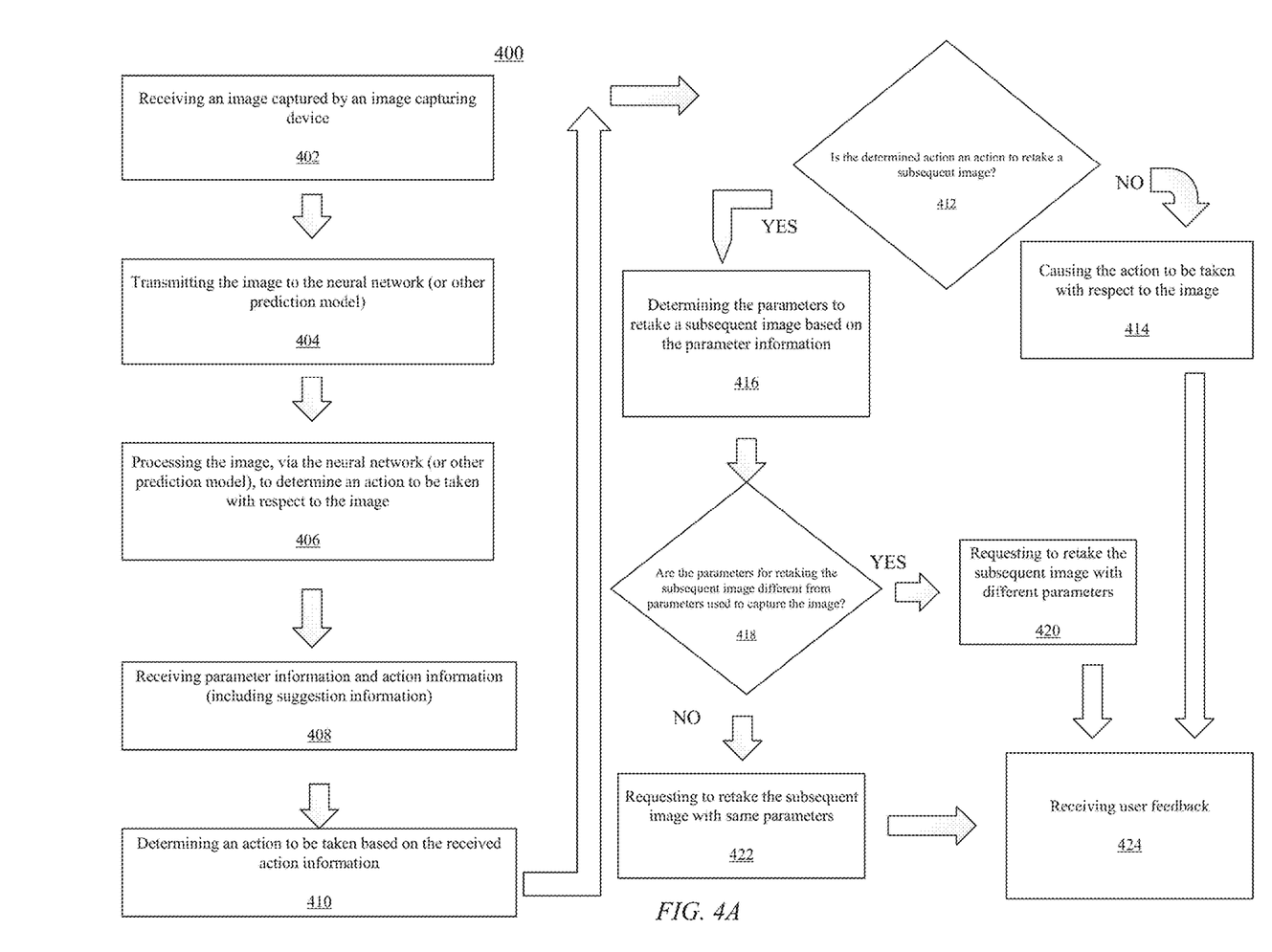
FIGS. 4A and 4B illustrate example flowcharts of methods of determining an action to be taken with respect to an image and determining parameters for retaking a subsequent image, in accordance with one or more embodiments.

FIG. 4A illustrates an example flowchart of a method 400 of determining an action to be taken with respect to an image and determining parameters for retaking a subsequent image. In operation 402, an image is received by the server(s) 102 from an image capturing device(s) 126. The image may be captured based on parameters entered by a technician/doctor of the imaging system(s) 124 or a user of the client device(s) 128. Alternatively, the parameters to capture the image can be determined, via the neural network(s) (or other prediction model(s)) 130, based on a request for capturing an image received at the server(s) 102 from a technician/doctor of the imaging system(s) 124 or a user of the client device(s) 128. The request may include a request to capture an image of a specific portion of a living organism, and the parameters can be determined, via the neural network(s) (or other prediction model(s)) 130, based on such a request. Alternatively, based on a request to capture an image from a technician/doctor of the imaging system(s) 124 or a user of the client device(s) 128, the parameters for capturing the image can be determined based on previously stored parameters in a memory.

In operation 404, the image is transmitted, from the server(s) 102, as an input to the neural network(s) (or other prediction model(s)) 130 via network 132, and the image is processed via the neural network(s) (or other prediction model(s)) 130 in operation 406 to determine an action to be taken with respect to the image. In operation 408, the server(s) 102 receives action information from the neural network(s) (or other prediction model(s)) 130 regarding an action to be taken with respect to the image after the image is processed via the neural network(s) (or other prediction model(s)) 130 and/or receives parameter information for retaking a subsequent image. In other words, the action information and the parameter information, received from the neural network(s) (or other prediction model(s)) 130, are determined by the neural network(s) (or other prediction model(s)) 130 based on the training of the neural network(s) (or other prediction model(s)) 130 and the image input into the neural network(s) (or other prediction model(s)) 130. As previously indicated, examples of actions to be taken with respect to the image include, but are not limited to, accepting the image, discarding the image, or retaking a subsequent image of the portion of the living organism. An action to accept an image may indicate that the image does not include an error, and an action to discard the image or retake a subsequent image may indicate that the image includes an error. For example, an image may be determined to include an error when an excitation frequency to capture the image is an incorrect frequency, when the image is blurry, when a position of a portion of a living organism within the image deviates from a center of the image by a predetermined threshold, or any other measure to determine an error in the image.

In some embodiments, action information regarding an action to be taken with respect to the image provided by the neural network(s) (or other prediction model(s)) 130 may include suggestion information. The suggestion information may include, for example, a 20% suggestion to retake a subsequent image and an 80% suggestion to accept the image. In other words, suggestion information may provide information regarding a suggestion percentage for an action to be taken with respect to the image. Based on the action information (and suggestion information included in the action information), server(s) 102 (e.g., action determining subsystem 110) determines an action to be taken with respect to the image in operation 410.

For instance, in operation 410, the server(s) 102 (e.g., action determining subsystem 110) may determine to accept the image when the suggestion percentage to accept the image is equal to or above a predetermined threshold. On the other hand, when the suggestion percentage to accept the image is below the predetermined threshold, the server(s) 102 (e.g., action determining subsystem 110) may determine to discard the image or retake a subsequent image. Similarly, the server(s) 102 (e.g., action determining subsystem 110) may determine to discard the image or retake a subsequent image when the suggestion percentage to discard the image or to retake a subsequent image is equal to or above a predetermined threshold. On the other hand, when the suggestion percentage to discard the image or retake a subsequent image is below the predetermined threshold, the server(s) 102 (e.g., action determining subsystem 110) may determine to accept the image.

Alternatively, in operation 410, the server(s) 102 (e.g., action determining subsystem 110) may determine an action based on the highest suggestion percentage. For instance, if the suggestion information includes a 60% suggestion to retake a subsequent image and a 40% suggestion to accept the image, the server(s) 102 (e.g., action determining subsystem 110) may determine to retake a subsequent image.

In operation 412, a determination is made as to whether the determined action to be taken in operation 410 is an action to retake a subsequent image. When the action determined in operation 410 is an action to discard the image or to accept the image (e.g., NO in operation 412), the server causes such an action to be taken with respect to the image in operation 414. For instance, when a determination is made to accept the image by the server(s) 102 (e.g., action determining subsystem 110) in operation 410, the server(s) 102 may transmit, in operation 414, the image via the network 132 to the client device(s) 128 and/or the imaging system(s) 124 so that the image can be displayed to a user of the client device(s) 128 or an operator or a doctor of the imaging system(s) 124.

When the action determined in operation 410 is an action to retake a subsequent image (e.g., YES in operation 412), the process proceeds to operation 416 instead of operation 414. In operation 416, the server(s) 102 determines the parameters for retaking a subsequent image based on the parameter information received from the neural network(s) (or other prediction model(s)) 130 in operation 408. Further, in operation 418, the server(s) 102 (e.g., parameter determining subsystem 112) determines whether the parameters to be used for retaking a subsequent image (which are determined in operation 416) are different from the parameters used for capturing the image that was input into the neural network(s) (or other prediction model(s)) 130 in operation 404.

If the parameter determining subsystem 112 determines that the parameters to be used for retaking a subsequent image are different (e.g., YES in operation 418), the parameter determining subsystem 112 requests, in operation 420, the transmitting subsystem 108 to transmit a request to the image capturing device(s) 126 (via network 132) to retake a subsequent image based on the different parameters. In other words, if the parameter determining subsystem 112 determines that the parameters to be used for retaking a subsequent image are different, the server(s) 102, in operation 420, controls the image capturing device(s) 126 to retake a subsequent image based on the parameters determined by the parameter determining subsystem 112.

If the parameter determining subsystem 112 determines that the parameters to be used for retaking a subsequent image are different in operation 418 (e.g., YES in operation 418), such a determination may indicate that the image location (of the image that was input into the neural network(s) (or other prediction model(s)) 130 in operation 404) is off compared to a desired image location, that an MRI excitation frequency of an image capturing device(s) 126 that captured the image (e.g., the image that was input into the neural network(s) (or other prediction model(s)) 130 in operation 404) is a wrong frequency, etc. In addition to the request to retake a subsequent image from the server(s) 102 to the image capturing device(s) 126, the server(s) 102 may also send a notification, in operation 420, to the image capturing device(s) 126 indicating the reason (for example, image location being off, wrong MRI excitation frequency, etc.) for different parameters to retake a subsequent image. The notification can be displayed to the living organism or the operator of the image capturing device(s) 126.

On the other hand, if the parameter determining subsystem 112 determines that the parameters to be used for retaking a subsequent image are the same (e.g., NO in operation 418), the parameter determining subsystem 112 determines, in operation 422, that the image that was input into the neural network(s) (or other prediction model(s)) 130 is a blurry image (for example, either because of the movement of a portion of a living organism during capture of the portion of the living organism or because of a movement of the image capturing device(s) 126 itself during capture of the portion of the living organism). Accordingly, if the parameter determining subsystem 112 determines that the parameters to be used for retaking a subsequent image are the same, the parameter determining subsystem 112 requests, in operation 422, the transmitting subsystem 108 to transmit a request to the image capturing device(s) 126 (via network 132) to retake a subsequent image based on the same parameters. In other words, if the parameter determining subsystem 112 determines that the parameters to be used for retaking a subsequent image are the same, the server(s) 102, in operation 422, controls the image capturing device(s) 126 to retake a subsequent image based on the same parameters. The request to retake a subsequent image may also include a message requesting the living organism to be still during capture of the subsequent image and/or requesting an operator of the image capturing device(s) 126 to make sure that the image capturing device(s) 126 is still during capture of the subsequent image. The message can be displayed to the living organism or the operator of the image capturing device(s) 126. Accordingly, the process described above is able to autonomously control the image capturing system(s) 124 (including the image capturing device(s) 126).

In operation 424, a user feedback (from the client device(s) 128, from an operator of the imaging system(s) 124, or any other source) can be provided to the server(s) 102 and neural network(s) (or other prediction model(s)) 130 regarding the determination of the action with respect to the image in operation 410 and/or the determination of parameters to be used to take a subsequent image in operation 416. The user feedback can be used to update and train the neural network(s) (or other prediction model(s)) 130. Although a user feedback is illustrated in operation 424, such feedback is not necessarily needed and is optional. Accordingly, after operation 420 or 422, the process can loop back to operation 402 (without user feedback) and repeat the method 400 (without user feedback) illustrated in FIG. 4A.

Further, in some embodiments, after the subsequent image is captured by the image capturing device(s) 126 in response to the request for retaking the subsequent image in operation 420 or 422, the subsequent image is sent back to the server(s) 102 (via network 132) and the above-described process (e.g., operations 402-424) is repeated to process the subsequent image. Also, in some embodiments, the server(s) 102 may assign weights to a first parameter to be used to capture a first image of a first portion of a first living organism and a second parameter used to retake a subsequent first image of the first portion of the first living organism based on a time of capture of the first image and the subsequent first image, and provide, as an input to the neural network(s) (or other prediction model(s)) 130 the assigned weights to train the neural network(s) (or other prediction model(s)) 130.

Figure 4B:
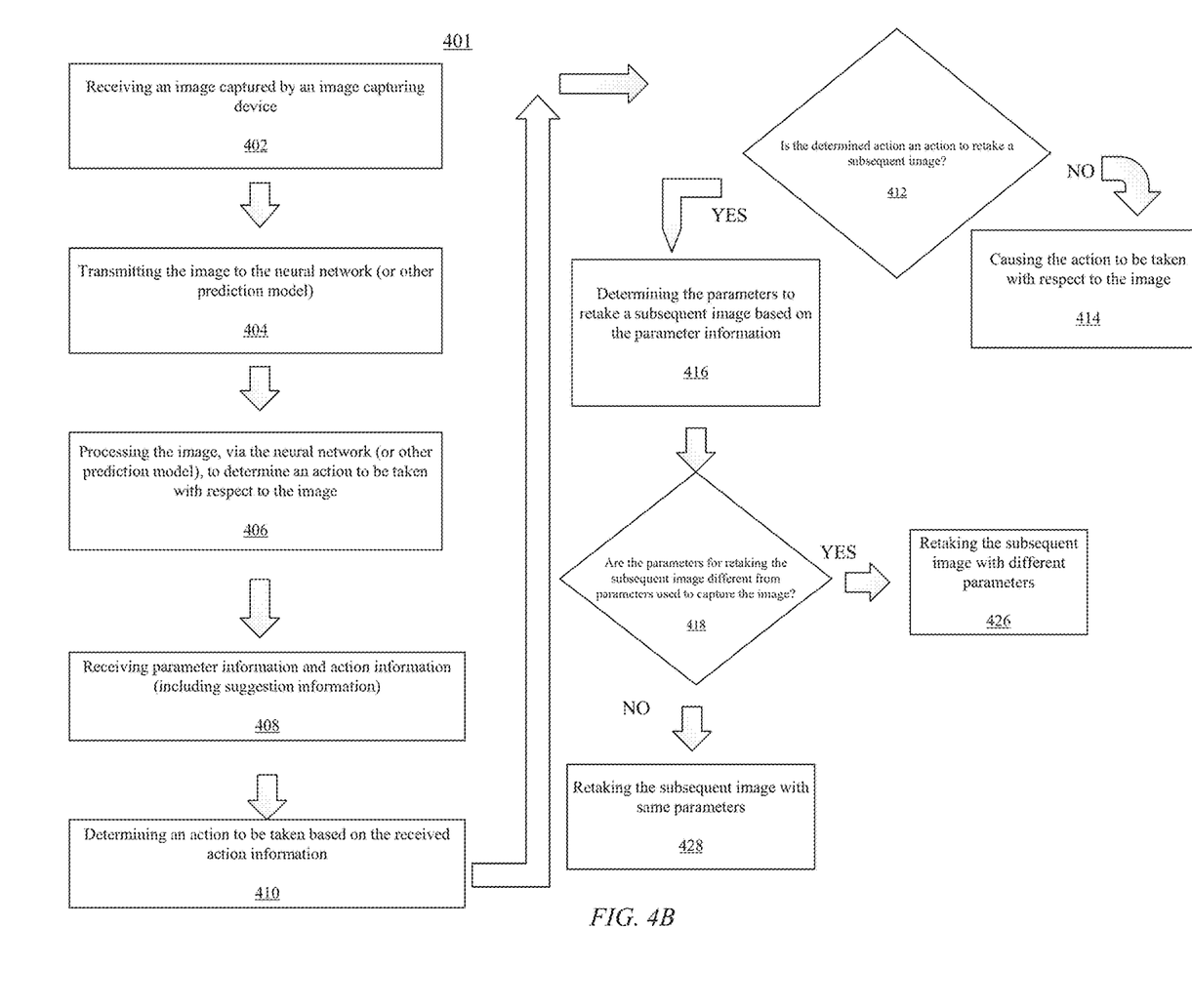

FIG. 4B illustrates an example flowchart of a method 401 of determining an action to be taken with respect to an image and determining parameters for retaking a subsequent image. The operations 402-418 in FIG. 4B are the same as operations 402-418 in FIG. 4A and thus are not discussed again for the sake of brevity.

If the parameter determining subsystem 112 determines that the parameters to be used for retaking a subsequent image are different (e.g., YES in operation 418), the parameter determining subsystem 112 requests the transmitting subsystem 108 to transmit a request to the image capturing device(s) 126 (via network 132) to retake a subsequent image, and the image capturing device(s) 126, in operation 426, retakes a subsequent image based on the different parameters. In other words, if the parameter determining subsystem 112 determines that the parameters to be used for retaking a subsequent image are different, the server(s) 102 controls the image capturing device(s) 126 to retake a subsequent image, and the image capturing device(s) 126 retakes a subsequent image in operation 426 based on the parameters determined by the parameter determining subsystem 112.

If the parameter determining subsystem 112 determines that the parameters to be used for retaking a subsequent image are different in operation 418 (e.g., YES in operation 418), such a determination may indicate that the image location (of the image that was input into the neural network(s) (or other prediction model(s)) 130 in operation 404) is off compared to a desired image location, that an MRI excitation frequency of an image capturing device(s) 126 that captured the image (e.g., the image that was input into the neural network(s) (or other prediction model(s)) 130 in operation 404) is a wrong frequency, etc. In addition to controlling, by the server(s) 102, the image capturing device(s) 126 to retake a subsequent image, the server(s) 102 may also send a notification to the image capturing device(s) 126 indicating the reason (for example, image location being off, wrong MRI excitation frequency, etc.) for different parameters to retake a subsequent image. The notification can be displayed to the living organism or the operator of the image capturing device(s) 126.

On the other hand, if the parameter determining subsystem 112 determines that the parameters to be used for retaking a subsequent image are the same (e.g., NO in operation 418), the parameter determining subsystem 112 determines that the image that was input into the neural network(s) (or other prediction model(s)) 130 is a blurry image (for example, either because of the movement of a portion of a living organism during capture of the portion of the living organism or because of a movement of the image capturing device(s) 126 itself during capture of the portion of the living organism). Accordingly, if the parameter determining subsystem 112 determines that the parameters to be used for retaking a subsequent image are the same, the parameter determining subsystem 112 requests the transmitting subsystem 108 to transmit a request to the image capturing device(s) 126 (via network 132) to retake a subsequent image based on the same parameters, and the image capturing device(s) 126 retakes the subsequent image in operation 428 based on the same parameters. In other words, if the parameter determining subsystem 112 determines that the parameters to be used for retaking a subsequent image are the same, the server(s) 102 controls the image capturing device(s) 126 to retake a subsequent image based on the same parameters, and the image capturing device(s) 126 retakes the subsequent image in operation 428 based on the same parameters.

In addition to controlling, by the server(s) 102, the image capturing device(s) 126 to retake a subsequent image, the server(s) 102 may also send a message to the image capturing device(s) 126 requesting the living organism to be still during capture of the subsequent image and/or requesting an operator of the image capturing device(s) 126 to make sure that the image capturing device(s) 126 is still during capture of the subsequent image. The message can be displayed to the living organism or the operator of the image capturing device(s) 126.

After operation 426 or 428 is performed, the method 401 loops back to operation 402 and repeats the method 401 illustrated in FIG. 4B until, for example, a subsequent image captured by the image capturing device(s) 126 is determined to be acceptable in operation 412. The method 401 illustrates autonomously determining an action to be taken with respect to an image and determining parameters for retaking subsequent images, thereby realizing an entire method without user feedback. For example, when a user requests an image capturing device(s) 126 to capture of a portion of a living organism, the method 401 is autonomously performed and repeated until, for example, a subsequent image captured by the image capturing device(s) 126 is determined to be acceptable in operation 412. The method 401 illustrates a one-button push concept where a user pushes a button (for example, a button to a request an image capturing device(s) 126 to capture an image) and the method 401 is autonomously performed and repeated until, for example, a subsequent image captured by the image capturing system 124 is determined to be acceptable in operation 412. Accordingly, the process described above is able to autonomously control the image capturing system(s) 124 (including the image capturing device(s) 126).

Figure 5:
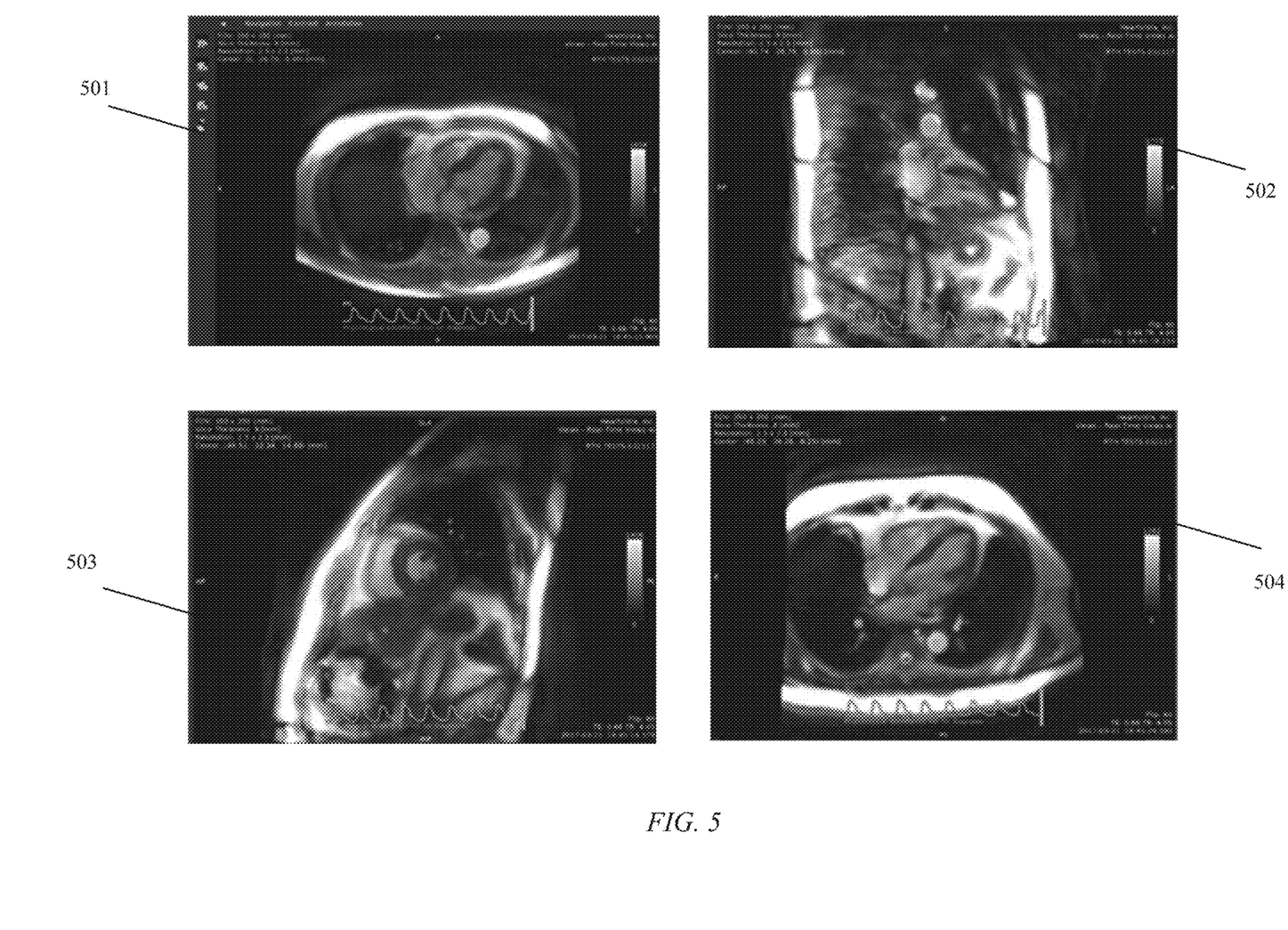
FIG. 5 illustrates images obtained by a system that facilitates autonomous control of an imaging system, in accordance with one or more embodiments.

FIG. 5 illustrates images 501-504 obtained by the system 100 that facilitates autonomous control of an imaging system(s) 124. In this example, the images 501-504 were obtained from an MRI (magnetic resonance imaging) system. The four images 501-5-4 represent four standard oblique cardiac views. Further, in this example, the neural network 130 was trained with training information from previous cardiac MRI examinations, including action information and parameter information (for example, geometric coefficients of a plane) with respect to a plurality of previously acquired cardiac images from previous cardiac MRI examinations. Based on such a training of the neural network(s) (or other prediction model(s)) 130, the images 501-504 illustrated in FIG. 5 were obtained based on the action information and parameter information provided by the trained neural network(s) (or other prediction model(s)) 130. The system and the methods described above in detail with regard to FIGS. 1-4B were used to acquire the images 501-504 illustrated in FIG. 5. In this example, all of the images illustrated in FIG. 5 were obtained at a desired location in less than 10 seconds.

In some embodiments, the various computers and subsystems illustrated in FIG. 1 may include one or more computing devices that are programmed to perform the functions described herein. The computing devices may include one or more electronic storages (e.g., training information database 114, database 103, or other electric storages), one or more physical processors programmed with one or more computer program instructions, and/or other components. The computing devices may include communication lines or ports to enable the exchange of information with a network (e.g., network 132) or other computing platforms via wired or wireless techniques (e.g., Ethernet, fiber optics, coaxial cable, WiFi, Bluetooth, near field communication, or other technologies). The computing devices may include a plurality of hardware, software, and/or firmware components operating together. For example, the computing devices may be implemented by a cloud of computing platforms operating together as the computing devices.

The electronic storages may include non-transitory storage media that electronically stores information. The electronic storage media of the electronic storages may include one or both of (i) system storage that is provided integrally (e.g., substantially non-removable) with servers or client devices or (ii) removable storage that is removably connectable to the servers or client devices via, for example, a port (e.g., a USB port, a firewire port, etc.) or a drive (e.g., a disk drive, etc.). The electronic storages may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. The electronic storages may include one or more virtual storage resources (e.g., cloud storage, a virtual private network, and/or other virtual storage resources). The electronic storage may store software algorithms, information determined by the processors, information obtained from servers, information obtained from client devices, or other information that enables the functionality as described herein.

The processors may be programmed to provide information processing capabilities in the computing devices. As such, the processors may include one or more of a digital processor, an analog processor, a digital circuit designed to process information, an analog circuit designed to process information, a state machine, and/or other mechanisms for electronically processing information. In some embodiments, the processors may include a plurality of processing units. These processing units may be physically located within the same device, or the processors may represent processing functionality of a plurality of devices operating in coordination. The processors may be programmed to execute computer program instructions to perform functions described herein of subsystems 106-112 or other subsystems. The processors may be programmed to execute computer program instructions by software; hardware; firmware; some combination of software, hardware, or firmware; and/ or other mechanisms for configuring processing capabilities on the processors.

It should be appreciated that the description of the functionality provided by the different subsystems 106-112 described herein is for illustrative purposes, and is not intended to be limiting, as any of subsystems 106-112 may provide more or less functionality than is described. For example, one or more of subsystems 106-112 may be eliminated, and some or all of its functionality may be provided by other ones of subsystems 106-112. As another example, additional subsystems may be programmed to perform some or all of the functionality attributed herein to one of subsystems 106-112.

Although the present invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the scope of the appended claims. For example, it is to be understood that the present invention contemplates that, to the extent possible, one or more features of any embodiment can be combined with one or more features of any other embodiment.

The present techniques will be better understood with reference to the following enumerated embodiments:

1. A method comprising: receiving training information, the training information including at least (i) 1,000 images that each correspond to a portion of a living organism, and (ii) for each image of the 1,000 images, action information indicating one or more actions taken with respect to the image, the one or more actions including acceptance of the image, discarding of the image, or retaking a subsequent image of the portion of the living organism to which the image corresponds to replace the image; providing, as input to a neural network, the 1,000 images and the action information for the 1,000 images to train the neural network regarding an action to take with respect to a new image corresponding to the portion of the living organism; controlling, using the neural network, an image capturing device to capture a first image of a first portion of a first living organism; processing, via the neural network, the first image to determine a first action to be taken with respect to the first image, the determination of the first action being based on the training of the neural network; and causing the first action to be taken with respect to the first image.

2. The method of embodiment of 1, wherein the training information includes, for each image of the 1,000 images, parameter information indicating one or more parameters used to control the image capturing device to capture the image, the method further comprising: providing, as input to the neural network, the parameter information for the 1,000 images to train the neural network regarding a parameter to use to control the image capture device to capture the new image corresponding to the portion of the living organism; and determining, via the neural network, a first parameter to be used to control the image capturing device to capture the first image, the determination of the first parameter being based on the training of the neural network, wherein the image capturing device is controlled based on the first parameter to capture the first image.

3. The method of embodiments of 1 or 2, the method further comprising: receiving user feedback regarding the determination of the first action; and providing the user feedback to the neural network to cause the neural network to be updated based on the user feedback.

4. The method of any of embodiments of 1-3, the method further comprising: determining the first action to be taken with respect to the first image to correspond to accepting the first image when the first image is determined not to include an error; and determining the first action to be taken with respect to the first image to correspond to discarding the first image or retaking a subsequent first image of the first portion of the first living organism to which the first image corresponds when the first image is determined to include an error.

5. The method of any of embodiments of 1-4, the method further comprising: determining that the first image includes the error when an excitation frequency to capture the first image is an incorrect frequency.

6. The method of any of embodiments of 1-5, the method further comprising: determining that the first image includes the error when the first image is blurry.

7. The method of any of embodiments of 1-6, wherein the first image is determined to be blurry when first living organism is determined to have moved during capture of the first image, or the image capturing device is determined to have moved during capture of the first image.

8. The method of any of embodiments of 1-7, the method further comprising: determining that the first image includes the error when a position of the first portion of the first living organism within the first image deviates from a center of the first image by a predetermined threshold.

9. The method of any of embodiments of 1-8, the method further comprising: controlling the image capturing device to retake a subsequent first image of the first portion of the first living organism to which the first image corresponds using the first parameter when the first image is blurry; and controlling the image capturing device to retake a subsequent first image of the first portion of the first living organism to which the first image corresponds using a second parameter, different from the first parameter, when the first image includes an error other than being blurry, the determination of the second parameter being based on the training of the neural network.

10. The method of any of embodiments of 1-9, the method further comprising: receiving user feedback regarding the subsequent first image; and providing the user feedback to the neural network to cause the neural network to be updated based on the user feedback.

11. The method of any of embodiments of 1-10, wherein the image capturing device is one of an X-Ray device, an Ultrasound device, an MRI (Magnetic Resonance Imaging) device, or a nuclear medicine imaging device.

12. The method of any of embodiments of 1-11, the method further comprising: determining, via the neural network, a first parameter to be used to control the image capturing device to capture the first image, the determination of the first parameter being based on the training of the neural network; determining, via the neural network, a second parameter to be used to control the image capturing device to retake a subsequent first image of the first portion of the first living organism to which the first image corresponds, the determination of the second parameter being based on the training of the neural network; assigning weights to the first parameter and the second parameter based on a time of capture of each of the first image and the subsequent first image; and providing, as an input to the neural network, the assigned weights to train the neural network.

13. The method of any of embodiments of 1-12, the method further comprising: receiving action information from the neural network, the action information being determined based on the processed first image and based on the training of the neural network; and determining the first action to be taken with respect to the first image based on the received action information.

14. The method of any of embodiments of 1-13, the method further comprising: receiving suggestion information from the neural network, the suggestion information being determined based on the processed first image and based on the training of the neural network, and the suggestion information including a suggestion percentage for each of the one or more actions; and determining the first action to be taken with respect to the first image based on the suggestion percentage for each of the one or more actions.

15. The method of any of embodiments of 1-14, the method further comprising: determining the first action to correspond to acceptance of the first image when the suggestion percentage for acceptance of the first image is equal to or above a predetermined threshold.

16. The method of any of embodiments of 1-15, the method further comprising: determining the first action to correspond to discarding of the first image or retaking a subsequent first image when the suggestion percentage for acceptance of the first image is below the predetermined threshold.

17. The method of any of embodiments of 1-16, the method further comprising: determining the first action based on a highest suggestion percentage among the suggestion percentage for each of the one or more actions.

18. The method of any of embodiments of 1-17, the method further comprising: determining, via the neural network, a subsequent parameter to be used to control the image capturing device to capture a subsequent first image when the first action is determined to correspond to retaking the subsequent first image; and controlling the image capturing device to capture the subsequent first image of the first portion of the first living organism based on the subsequent parameter.

19. A method comprising: receiving training information, the training information including at least (i) a plurality of images that each correspond to a portion of a living organism, and (ii) for each image of the plurality of images, action information indicating one or more actions taken with respect to the image, the one or more actions including acceptance of the image, discarding of the image, or retaking a subsequent image of the portion of the living organism to which the image corresponds to replace the image; providing, as input to a prediction model, the plurality of images and the action information for the plurality of images to train the prediction model regarding an action to take with respect to a new image corresponding to the portion of the living organism; controlling, using the prediction model, an image capturing device to capture a first image of a first portion of a first living organism; processing, via the prediction model, the first image to determine a first action to be taken with respect to the first image, the determination of the first action being based on the training of the prediction model; and causing the first action to be taken with respect to the first image.

20. The method of embodiment of 19, wherein the training information includes, for each image of the plurality of images, parameter information indicating one or more parameters used to control the image capturing device to capture the image, and the method further comprising: providing, as input to the prediction model, the parameter information for the plurality of images to train the prediction model regarding a parameter to use to control the image capture device to capture the new image corresponding to the portion of the living organism; and determining, via the prediction model, a first parameter to be used to control the image capturing device to capture the first image, the determination of the first parameter being based on the training of the prediction model, wherein the image capturing device is controlled based on the first parameter to capture the first image.

21. The method of any of embodiments of 19 and 20, the method further comprising: receiving user feedback regarding the determination of the first action; and providing the user feedback to the prediction model to cause the prediction model to be updated based on the user feedback.

22. The method of any of embodiments of 19-21, the method further comprising: determining the first action to be taken with respect to the first image to correspond to accepting the first image when the first image is determined not to include an error; and determining the first action to be taken with respect to the first image to correspond to discarding the first image or retaking a subsequent first image of the first portion of the first living organism to which the first image corresponds when the first image is determined to include an error.

23. The method of any of embodiments of 19-22, the method further comprising determining that the first image includes the error when an excitation frequency to capture the first image is an incorrect frequency.

24. The method of any of embodiments of 19-23, the method further comprising determining that the first image includes the error when the first image is blurry.

25. The method of any of embodiments of 19-24, wherein the first image is determined to be blurry when first living organism is determined to have moved during capture of the first image, or the image capturing device is determined to have moved during capture of the first image.

26. The method of any of embodiments of 19-25, the method further comprising determining that the first image includes the error when a position of the first portion of the first living organism within the first image deviates from a center of the first image by a predetermined threshold.

27. The method of any of embodiments of 19-26, the method further comprising: controlling the image capturing device to retake a subsequent first image of the first portion of the first living organism to which the first image corresponds using the first parameter when the first image is blurry; and controlling the image capturing device to retake a subsequent first image of the first portion of the first living organism to which the first image corresponds using a second parameter, different from the first parameter, when the first image includes an error other than being blurry, the determination of the second parameter being based on the training of the prediction model.

28. The method of any of embodiments of 19-27, the method further comprising: receiving user feedback regarding the subsequent first image; and providing the user feedback to the prediction model to cause the prediction model to be updated based on the user feedback.

29. The method of any of embodiments of 19-28, wherein the image capturing device is one of an X-Ray device, an Ultrasound device, an MRI (Magnetic Resonance Imaging) device, or a nuclear medicine imaging device.

30. The method of any of embodiments of 19-29, the method further comprising: determining, via the prediction model, a first parameter to be used to control the image capturing device to capture the first image, the determination of the first parameter being based on the training of the prediction model; determining, via the prediction model, a second parameter to be used to control the image capturing device to retake a subsequent first image of the first portion of the first living organism to which the first image corresponds, the determination of the second parameter being based on the training of the prediction model; assigning weights to the first parameter and the second parameter based on a time of capture of each of the first image and the subsequent first image; and providing, as an input to the prediction model, the assigned weights to train the prediction model.

31. The method of any of embodiments of 19-30, the method further comprising: receiving action information from the prediction model, the action information being determined based on the processed first image and based on the training of the prediction model; and determining the first action to be taken with respect to the first image based on the received action information.

32. The method of any of embodiments of 19-31, the method further comprising: receiving suggestion information from the prediction model, the suggestion information being determined based on the processed first image and based on the training of the prediction model, and the suggestion information including a suggestion percentage for each of the one or more actions; and determining the first action to be taken with respect to the first image based on the suggestion percentage for each of the one or more actions.

33. The method of any of embodiments of 19-32, the method further comprising: determining the first action to correspond to acceptance of the first image when the suggestion percentage for acceptance of the first image is equal to or above a predetermined threshold.

34. The method of any of embodiments of 19-33, the method further comprising determining the first action to correspond to discarding of the first image or retaking a subsequent first image when the suggestion percentage for acceptance of the first image is below the predetermined threshold.

35. The method of any of embodiments of 19-34, the method further comprising determining the first action based on a highest suggestion percentage among the suggestion percentage for each of the one or more actions.

36. The method of any of embodiments of 19-35, the method further comprising: determining, via the prediction model, a subsequent parameter to be used to control the image capturing device to capture a subsequent first image when the first action is determined to correspond to retaking the subsequent first image; and controlling the image capturing device to capture the subsequent first image of the first portion of the first living organism based on the subsequent parameter.

37. A tangible, non-transitory, machine-readable medium storing instructions that when executed by a data processing apparatus cause the data processing apparatus to perform operations comprising those of any of embodiments 1-36.

38. A system, comprising: one or more processors; and memory storing instructions that when executed by the processors cause the processors to effectuate operations comprising those of any of embodiments 1-36.

The invention claimed is:

1. A system for facilitating autonomous control of an imaging system, the system comprising:
   one or more processors configured by machine-readable instructions to:
   receive a training set comprising images of a portion of a living organism and action information for the images, the action information indicating acceptance of an image, discarding of the image, and retaking and replacing the image with a retake image:
   provide, as input to a neural network, the training set comprising the images and the action information to train the neural network regarding whether to accept, disregard, or retake and replace a new image;
   determine, via the trained neural network, a first parameter to be used to control an image capturing device to capture a first image of a first portion of a first living organism;
   determine, based on the trained neural network processing the first image, that a first action to be taken for the first image comprises retaking and replacing the first image with a retake first image and a second parameter to be used to control the image capturing device to capture the retake first image;
   determine whether the second parameter matches the first parameter; and
   in response to determining that the second parameter does not match the first parameter, transmitting a request to the image capturing device to retake the first image using the second parameter, wherein the request comprises basis for parameter change.

2. The system of claim 1, wherein the one or more processors are configured to:
   provide, as input to the neural network, parameter information corresponding to the training set comprising the images to train the neural network regarding a parameter to use to control the image capturing device to capture the new image corresponding to the portion of the living organism, the parameter information indicating one or more parameters used to control the image capturing device to capture each image of the training set comprising images.

3. The system of claim 2, wherein the one or more processors are configured to:
   determine that the first image is blurry responsive to determining, via the trained neural network, that the second parameter should match the first parameter:
   control the image capturing device to retake the first image using the first parameter when the first image is blurry; and
   control the image capturing device to retake the first image using the second parameter, different from the first parameter, when the first image includes an error other than being blurry.

4. The system of claim 3, wherein the one or more processors are configured to:
   receive user feedback regarding the retake first image; and
   provide the user feedback to the neural network to cause the neural network to be updated based on the user feedback.

5. The system of claim 1, wherein the one or more processors are configured to:
   in response to determining that the second parameter matches the first parameter, transmitting the request to the image capturing device to retake the first image, wherein the request comprises an instruction to be provided to the living organism.

6. The system of claim 1, wherein the one or more processors are configured to:
   determine a second action to be taken with respect to a second image to correspond to the acceptance of the second image when the first image is determined not to include an error; and determine the second action to be taken with respect to the second image to correspond to discarding of the second image or retaking of a subsequent second image when the second image is determined to include the error.

7. The system of claim 6, wherein the image capturing device comprises a magnetic resonance imaging (MRI) device, and wherein the one or more processors are configured to determine that the second image includes the error when an excitation frequency of the MRI used to capture the first image is an incorrect frequency.

8. The system of claim 6, wherein the one or more processors are configured to determine that the second image includes the error when the second first image is blurry.

9. The system of claim 8, wherein the second image is determined to be blurry responsive to determining, via the trained neural network, that the second parameter, to be used to control the image capturing device to retake the second image, should match the first parameter; the determination that the second parameter should match the first parameter indicating that the first living organism moved during capture of the second image, or the image capturing device moved during the capture of the second image.

10. The system of claim 6, wherein the one or more processors are configured to determine that the second image includes the error when a position of the first portion of the first living organism within the second image deviates from a center of the second image by a predetermined threshold.

11. The system of claim 1, wherein the image capturing device is one of an X-Ray device, an Ultrasound device, an MRI (Magnetic Resonance Imaging) device, or a nuclear medicine imaging device.

12. The system of claim 1, wherein the one or more processors are configured such that the first parameter and the second parameter are different.

13. The system of claim 1, wherein the one or more processors are configured to:
receive additional action information from the neural network, the additional action information being determined based on the first image and based on training of the neural network; and
determine the first action to be taken with respect to the first image based on the additional action information.

14. The system of claim 1, wherein the one or more processors are configured to:
receive suggestion information from the neural network, the suggestion information being determined based on the first image and based on training of the neural network, and the suggestion information including a suggestion percentages for the acceptance of the first image, discarding of the first image, and retaking of the first image of the portion of the living organism to which the first image corresponds to replace the first image; and
determine the first action to be taken with respect to the first image based on the suggestion percentages.

15. The system of claim 14, wherein the one or more processors are configured to: determine the first action to correspond to the acceptance of the first image when a suggestion percentage for acceptance of the first image is equal to or above a predetermined threshold.

16. The system of claim 15, wherein the one or more processors are configured to determine the first action to correspond to discarding of the first image or retaking of the first image of the first portion of the first living organism to which the first image corresponds when the suggestion percentage for the acceptance of the first image is below the predetermined threshold.

17. The system of claim 14, wherein the one or more processors are configured to determine the first action based on a highest suggestion percentage from among the suggestion percentages.

18. The system of claim 1, wherein the one or more processors are configured to:
control the image capturing device to capture the retake first image of the first portion of the first living organism based on the second parameter.

19. A system for facilitating autonomous control of an imaging system, the system comprising:
one or more processors configured by machine-readable instructions to:
receive a training set comprising images of a portion of a living organism and action information for the images, the action information indicating acceptance of an image, discarding of the image, and retaking and replacing the image with a retake image;
provide, as input to a prediction model, the training set comprising the images and the action information to train the prediction model regarding whether to accept, disregard, or retake and replace a new image;
determine, via the trained prediction model, a first parameter to be used to control an image capturing device to capture a first image of a first portion of a first living organism;
determine, based on the trained prediction model processing the first image, that a first action to be taken for the first image comprises retaking and replacing the first image with a retake first image and a second parameter to be used to control the image capturing device to capture the retake first image;
determine whether the second parameter matches the first parameter; and
in response to determining that the second parameter does not match the first parameter, transmitting a request to the image capturing device to retake the first image using the second parameter, wherein the request comprises basis for parameter change.

20. A method for facilitating autonomous control of an imaging system, the method comprising:
receiving a training set comprising images of a portion of a living organism and action information for the images, the action information indicating acceptance of an image, discarding of the image, and retaking and replacing the image with a retake image;
providing, as input to a prediction model, the training set comprising the images and the action information to train the prediction model regarding whether to accept, disregard, or retake and replace a new image;
determining, via the prediction model, a first parameter to be used to control an image capturing device to capture a first image of a first portion of a first living organism;
determining, based on the trained prediction model processing the first image, that a first action to be taken for the first image comprises retaking and replacing the first image with a retake first image and a second parameter to be used to control the image capturing device to capture the retake first image;
determine whether the second parameter matches the first parameter; and
in response to determining that the second parameter does not match the first parameter, transmitting a request to the image capturing device to retake the first image using the second parameter, wherein the request comprises basis for parameter change.

* * * * *